(12) United States Patent
Shor et al.

(10) Patent No.: US 11,114,352 B2
(45) Date of Patent: Sep. 7, 2021

(54) PROCESS MONITOR CIRCUITRY WITH MEASUREMENT CAPABILITY

(71) Applicant: Birad—Research & Development Company Ltd., Ramat Gan (IL)

(72) Inventors: Joseph Shor, Tel Mond (IL); Liron Lisha, Petach Tikva (IL)

(73) Assignee: Birad—Research & Development Company Ltd., Ramat Gan (IL)

(*) Notice: Subject to any disclaimer, the term of this patent is extended or adjusted under 35 U.S.C. 154(b) by 110 days.

(21) Appl. No.: 16/550,236

(22) Filed: Aug. 25, 2019

(65) Prior Publication Data

US 2021/0057294 A1 Feb. 25, 2021

(51) Int. Cl.
*H01L 21/66* (2006.01)
*H01L 21/67* (2006.01)

(52) U.S. Cl.
CPC ........ *H01L 22/34* (2013.01); *H01L 21/67253* (2013.01); *H01L 22/14* (2013.01)

(58) Field of Classification Search
CPC .... H01L 22/34; H01L 21/67253; H01L 22/14
See application file for complete search history.

(56) References Cited

U.S. PATENT DOCUMENTS

| 5,903,012 A * | 5/1999 | Boerstler | G05F 3/262 257/48 |
| 2004/0108866 A1* | 6/2004 | Burns | H01L 22/20 324/762.02 |
| 2005/0057275 A1* | 3/2005 | Ngyuen | H03K 19/0005 326/30 |
| 2010/0301398 A1* | 12/2010 | Rothberg | G01N 27/27 257/253 |
| 2017/0199089 A1* | 7/2017 | Fritchman | G01K 15/005 |

OTHER PUBLICATIONS

ECE102 Lecture Notes (Winter 2010) (Year: 2010).*

* cited by examiner

*Primary Examiner* — Christopher P McAndrew
*Assistant Examiner* — Zannatul Ferdous
(74) *Attorney, Agent, or Firm* — Dekel Patent Ltd.; David Klein

(57) ABSTRACT

A process monitor circuitry is described that can measure the electron mobility ($\mu$), oxide capacitance ($C_{ox}$) and threshold voltage ($V_{th}$) of an integrated circuit.

20 Claims, 4 Drawing Sheets

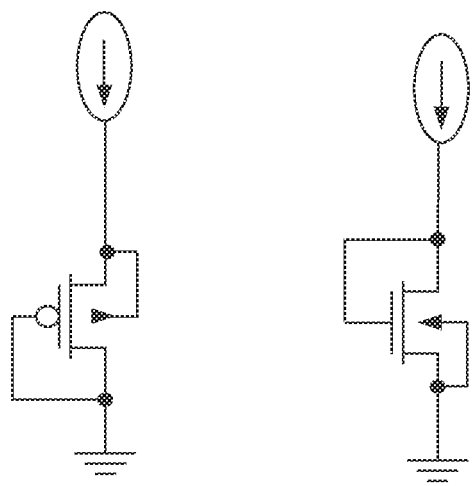
FIG. 1 - PRIOR ART
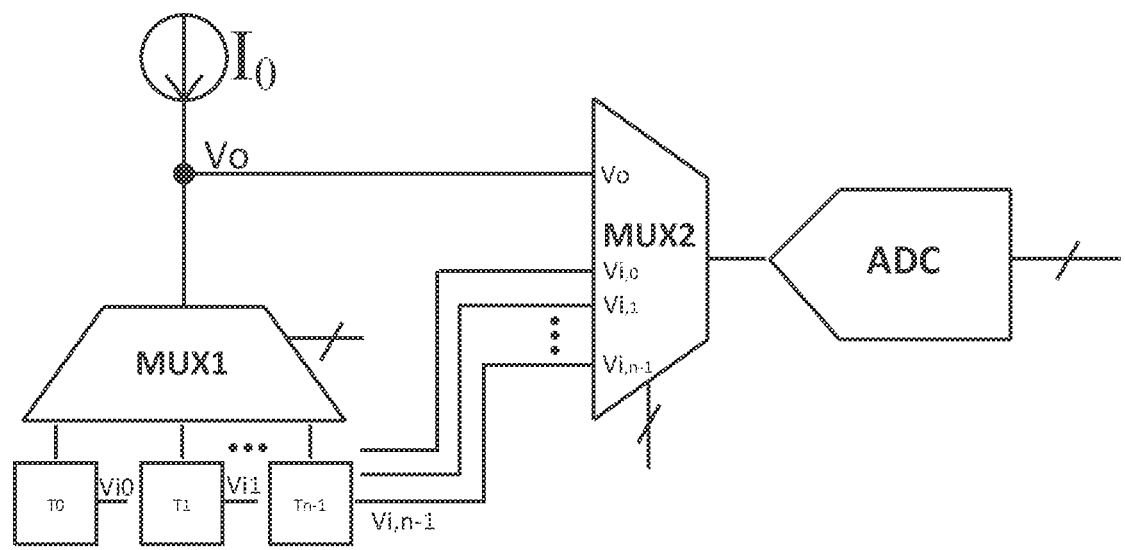
FIG. 2

PROCESS MONITOR CIRCUITRY WITH MEASUREMENT CAPABILITY

FIELD OF THE INVENTION

The present invention relates generally to process monitor circuitry of integrated circuits, and particularly to process monitor circuitry that can measure the electron mobility ($\mu$), oxide capacitance ($C_{ox}$) and threshold voltage ($V_{th}$) of an integrated circuit.

BACKGROUND OF THE INVENTION

The speed and performance of an integrated circuit (IC) depends on the specific characteristics of the transistors which make up the circuit. During the manufacturing process, there are several types of variations which can affect the transistor performance and hence degrade the circuit utility. First, systematic variations between wafers and lots can change the operating frequencies and performance of the IC's. This is known as "process" variation. In the design of the IC's the circuits are usually simulated in "slow", "fast" and "typical" process corners to cover this range of possibilities. (Process corners represent the extremes of parameter variations within which a circuit that has been etched onto the wafer must function correctly.) In addition to the process corner, there can be a "mismatch" across a single die. This variation is local and can occur in the same die for adjacent transistors, and is especially pronounced for small devices.

The following equations govern the behavior of the MOSFETs:

$$\text{Linear region: } I_D = \mu C_{ox} * \frac{W}{L}\left[(V_{gs} - V_{th})V_{ds} - \frac{1}{2}V_{ds}^2\right] \quad (1)$$

$$\text{Saturation Region: } I_D = \frac{1}{2}\mu C_{ox} * \frac{W}{L}[(V_{gs} - V_{th})^2] \quad (2)$$

$\mu$=electron mobility, $C_{ox}$=oxide capacitance and $V_{th}$=threshold voltage.

W and L are the width and length of the device, respectively.

$I_d$, $V_{gs}$, $V_{ds}$ are the drain current, gate-source voltage, and drain source voltage.

$C_{ox}$ is a parameter which is very well controlled by the process and does not vary across corners. It is also constant with temperature. $V_{th}$ and $\mu$ both vary across corners and both are reduced as temperature increases.

In addition, the equation describing the effect of mismatch on $V_{th}$ (the dominant mismatch parameter) is:

$$\partial V_{th} = \frac{A}{\sqrt{WL}} \quad (3)$$

$\partial V_{th}$ is the standard deviation of the variation in $V_{th}$ due to mismatch and A is a process-dependent parameter. For a 65 nm minimum sized device the $\partial V_{th}$ is roughly 15 mV. For every 2× increase of both W and L, the $\partial V_{th}$ is reduced by 2×.

When chips are manufactured, it is very important to know to which process corner they belong in order to anticipate the expected performance. There are circuits called Process Monitors (PM) or Critical Path Monitors (CPM), which are basically ring oscillator circuits. The frequency of the CPM's can indicate the process corner to which the chip belongs. However, prior art process monitors mix up the different parameters $\mu$, $C_{ox}$ and $V_{th}$ into the same output. They cannot distinguish between these parameters.

FIG. 1 shows prior-art diode-connected PMOS and NMOS devices. According to one definition of $V_{th}$, the $V_{th}$ is $V_{gs}$ value of a single minimum transistor leg at an $I_d$=100 nA. It is possible to extract the $V_{th}$ and reduce the random mismatch by placing a much larger current across many legs. For example, if 10 μA were driven across 100 minimal sized legs, the $\partial V_{th}$ sigma would be 1.5 mV according to the analysis given earlier. It is possible to measure such devices in this manner using expensive testing equipment. This is done by manufacturers. The devices are placed in the scribe lines between chips and can be measured using highly accurate current sources. The end-user or OEM has a much more difficult time measuring this, since it would require wasting a costly package pin on the die.

SUMMARY OF THE INVENTION

The present invention seeks to provide process monitor circuitry which can measure the electron mobility ($\mu$), oxide capacitance ($C_{ox}$) and threshold voltage ($V_{th}$) of an integrated circuit, each parameter being measured independently of another, as is described more in detail hereinbelow. The circuitry can also measure temperature of the IC. All of the circuitry is on-die and does not require any external measuring equipment, which makes it very convenient for the user in a high volume manufacturing environment.

BRIEF DESCRIPTION OF THE DRAWINGS

The present invention will be understood and appreciated more fully from the following detailed description taken in conjunction with the drawings in which:

FIG. 1 is a circuit diagram of prior-art diode-connected PMOS and NMOS devices;

FIG. 2 is a simplified circuit diagram of process monitor circuitry, in accordance with a non-limiting embodiment of the present invention;

DETAILED DESCRIPTION

Reference is now made to FIG. 2, which illustrates a simplified circuit diagram of process monitor circuitry, in accordance with a non-limiting embodiment of the present invention.

Current source $I_0$ is a highly accurate, on-die process and temperature independent current source. It sources a first multiplexer MUX1, from which one composite element is selected to be measured (the composite elements are referred to as $T_0, T_1, \ldots T_{n-1}$). This element can be a diode connected device, such as shown in FIG. 1 or something else. Note that there are usually several types of devices in a modern CMOS process, which can be $SV_t$ (standard $V_{th}$), $HV_t$ (high $V_{th}$), $LV_t$ (low $V_{th}$), IO (input/output devices) and others, so that an array of possibilities are available for MUX1. When a diode-connected device is utilized, the $V_{gs}$ value of the device appears at node $V_o$, and can be transferred to an analog-to-digital converter (ADC) via a second multiplexer MUX2. The output of the ADC is a digital word which represents the parameter measured. In addition to the first multiplexer MUX1 output $V_o$, it is also beneficial to measure some of the internal nodes $V_{i,0}, V_{i,1}, \ldots V_{i,n-1}$ of the different elements through the second multiplexer MUX2, as will be shown.

Figure 3A:
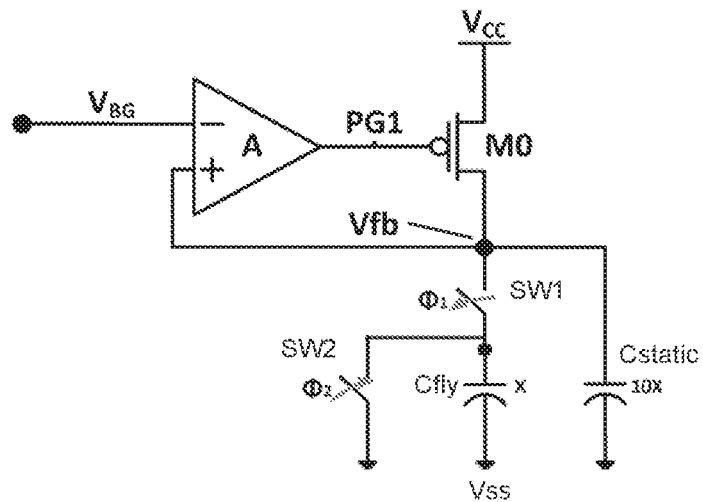
FIG. 3A is a simplified circuit diagram of circuitry for generating a constant current source for the process monitor circuitry, in accordance with a non-limiting embodiment of the present invention.

The non-limiting circuitry for generating the constant current source is shown in FIG. 3A and is now described. In general, throughout the specification and claims, the term "connected" means a direct electrical connection between the things that are connected, without any intermediary devices. The term "coupled" means either a direct electrical connection between the things that are connected or an indirect connection through one or more passive or active intermediary devices. The term "circuit" or "circuitry" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on." For purposes of the embodiments, the transistors are metal oxide semiconductor (MOS) transistors, which include drain, source, gate, and bulk terminals, but the transistors may include any device implementing transistor functionality, such as without limitation, bi-polar junction transistors—BJT PNP/NPN, BiCMOS, CMOS, eFET, etc. Note that the inverter elements shown in the schematics have an input and an output which are shown explicitly in the schematic, but there is also implied a positive supply terminal (Vcc) and a negative supply terminal (Vss) of the inverters. When the negative and positive supply terminals are not connected to anything, it is implied that the negative supply terminal is connected to Vss, the negative supply, while the positive supply terminal is connected to Vcc, the positive supply, as is known in the art. Some of the schematics show connections of the implied negative and positive supply terminals to different supplies.

In FIG. 3A, a voltage input $V_{bg}$, which is an accurate on-die reference voltage generated by a bandgap circuit, as is known in the art, is input to a negative input of an amplifier A, whose output is coupled to a gate of a PMOS transistor M0 via a node PG1. The source of PMOS transistor M0 is coupled to voltage Vcc and its drain is coupled to a node $V_{fb}$, which is coupled to a positive input of amplifier A.

Node $V_{fb}$ is also coupled to a switched-capacitor circuit formed by a flying capacitor $C_{fly}$, a static capacitor $C_{static}$ and at least two switches. In the illustrated embodiment, node $V_{fb}$ is coupled to a switch SW1 which is coupled to the anode side of the flying capacitor $C_{fly}$ and another switch SW2 is also coupled to the anode side of the flying capacitor $C_{fly}$. These switches are non-overlapping switches, which receive anti-phase frequency inputs from clocks Φ1 and Φ2.

The cathode side of flying capacitor $C_{fly}$ is coupled to voltage $V_{ss}$. The anode side of static capacitor $C_{static}$ is coupled to node $V_{fb}$ and the cathode side is either grounded or coupled to voltage $V_{ss}$.

Figure 3B:
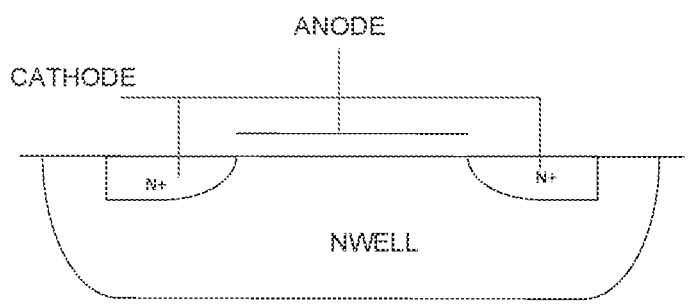
FIG. 3B is a simplified diagram of an NMOS capacitor NMOSCAP, which is an accumulation MOS capacitor with an NMOS transistor structure which is placed in an NWELL and is the switched-capacitor element of FIG. 3A.

Accordingly, the capacitor $C_{fly}$ is switched between $V_{fb}$ and $V_{ss}$, such that its current can be described as:

$$I = C_{fly} V_{fb} f \qquad (4)$$

where f represents the frequency. The feedback loop forces transistor M0 to provide this current to the switched capacitor. In accordance with an embodiment of the invention, in order to make the switched capacitor unique for process monitor circuitry and also make it temperature independent, the capacitor forming $C_{fly}$ can be an MOS capacitor, either an accumulation or an inversion capacitor. Such a capacitor is dependent on $C_{ox}$, which is a parameter independent of process and temperature. The only dependence of $C_{ox}$ is on the bias voltage, which is controlled by $V_{bg}$. The switch capacitor $C_{fly}$ is referred to as a switched-capacitor element. The most process independent capacitor is an NMOSCAP, which is an accumulation MOS capacitor with an NMOS transistor structure which is placed in an NWELL. This structure cannot function as a transistor, but will have very good capacitance characteristics. In a normal NMOS device, a high capacitance is only developed when the bias voltage exceeds the threshold voltage $V_{th}$. For the NMOSCAP, even at zero bias, there is a large capacitance. Thus, the NMOSCAP is the optimal capacitor for this application. The NMOSCAP is shown in FIG. 3B. This is one preferred embodiment of the flying capacitor $C_{fly}$ of FIG. 3A.

Figure 4:
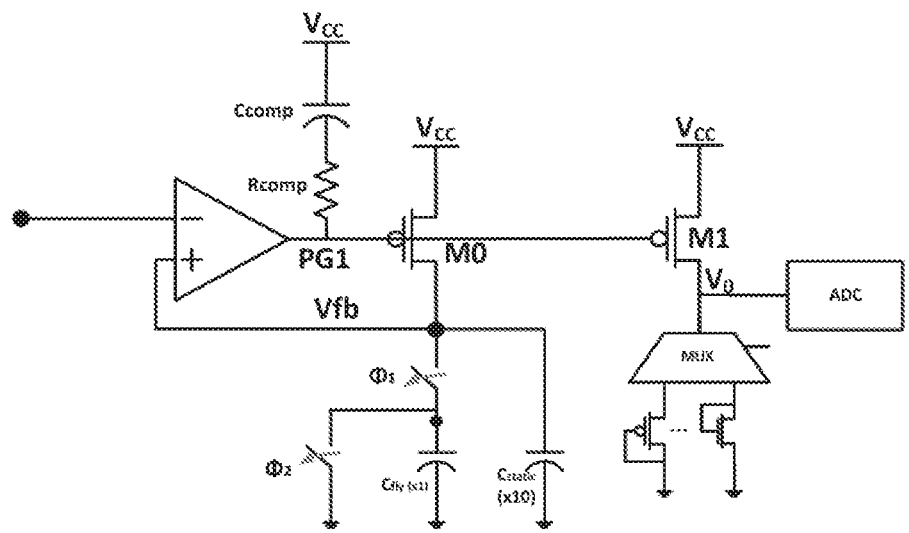
FIG. 4 is a simplified circuit diagram of an application of the constant current source for $V_{th}$ measurements.

An application of the constant current source for $V_{th}$ measurements is shown in FIG. 4. The circuitry of FIG. 4 is the same as the circuitry of FIG. 3A with the following additions. A resistor $R_{comp}$ may be optionally coupled between node PG1 and the anode side of a capacitor $C_{comp}$ whose anode side is coupled to voltage $V_{cc}$. (The resistor $R_{comp}$ and capacitor $C_{comp}$ are optional compensation elements to stabilize the loop if needed.) The gate of transistor M0 is coupled to a gate of a PMOS transistor M1, such that transistor M1 has the same current as transistor M0. The structure of M0 and M1 can be referred to as a current mirror and the current of M0 is accurately mirrored to M1. This is one technique to transfer the accurate switched-capacitor currents to the composite elements via the MUX. The source of transistor M1 is coupled to $V_{cc}$ and the drain of transistor M1 is coupled to the node $V_0$ of FIG. 2. This means the output current of transistor M1 is input to the multiplexer MUX1 of FIG. 2 to drive one of the selected diode-connected devices and $V_0$ is input to the analog-to-digital converter ADC to derive a digital word representing $V_{th}$.

The transistors M0 and M1 can be long-L devices or cascoded devices in order to eliminate the drain effect, as is known in the art.

Figure 5:
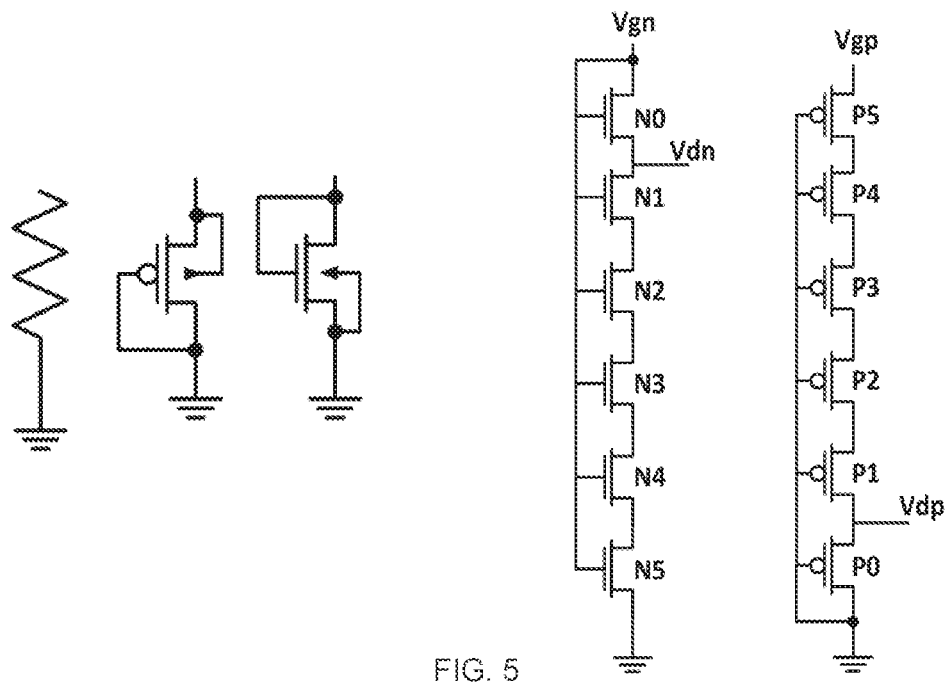
FIG. 5 are simplified circuit diagrams of composite circuit elements which can be measured with the process monitor circuitry of an embodiment of the invention.

Examples of composite circuit elements which can be measured are shown in FIG. 5. On the left side of FIG. 5, a resistor, a PMOS diode connected device and an NMOS diode connected device are shown. In these cases, the composite elements are a single device. In the diode-connected devices, the bulk node is connected to the source to eliminate the bulk effect, which could cause errors in the measurement. This is implicit in all of the figures in this disclosure. For advanced processes, such as finFET, where there is no bulk effect, this connection will not be required. The resistor can be used to measure $C_{ox}$. As mentioned earlier, the current driven to multiplexer MUX1 is dependent on $C_{ox}$. Many of the resistors in the CMOS process, such as metal resistors and salicide (self-aligned silicide) resistors have a very small temperature or zero temperature dependence. Thus measuring the voltage across a known resistor can yield the value of $C_{ox}$.

On the right side of FIG. 5, an NMOS stack (NMOS transistors N0, N1, . . . N5) and a PMOS stack (PMOS transistors P0, P1, . . . P5) are shown as the composite elements. A transistor stack is made of series-connected transistors. For both NMOS and PMOS, the source of transistor $N_k$ or $P_k$ is coupled to the drain of transistor $N_{k+1}$ or $P_{k+1}$, respectively. These stacks are structures which are used to measure the electron mobility (μ). Referring again to FIG. 2, the current will be driven to the Vg* node and both the Vg* and Vd* nodes will be measured by the second multiplexer MUX2 sequentially by the analog-to-digital converter ADC. For these stacks the stack drain is the drain of the transistor which is connected to all of the gates of the transistors in the stack. For the NMOS stack, this is N0, while for the PMOS stack, it is P0. The top of the stack is the point where the current enters. This is Vgn for the NMOS stack and Vgp for the PMOS. The amount of transistors in the stack can be two or more.

Figure 6:
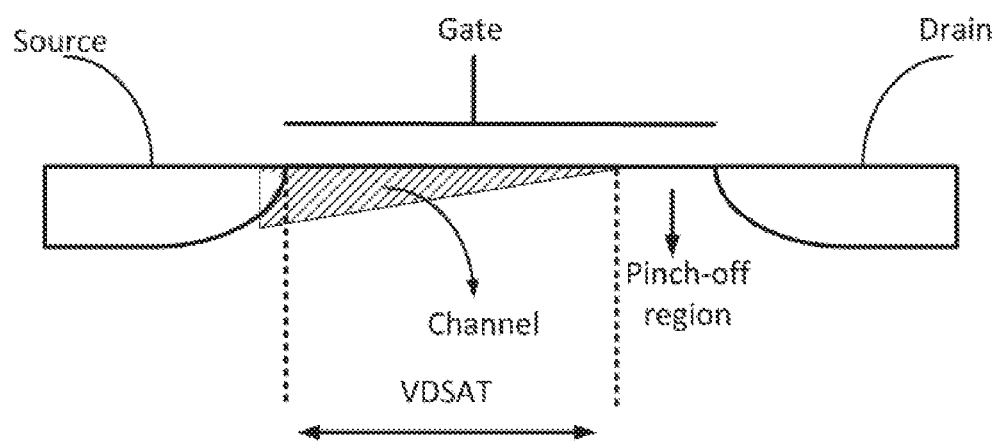
FIG. 6 is a simplified diagram of a saturated MOS device.

In order to understand how the mobility measurement is conducted, reference is now made to FIG. 6, which shows a saturated MOS device. The pinch-off region is shown, as well as the channel. The voltage across the channel is sometimes referred to as Vdsat, where:

$$Vdsat = Vgs - Vth \quad (5)$$

According to (2):

$$Vdsat = \sqrt{\frac{I_D}{\frac{1}{2}\mu C_{ox} * \frac{W}{L}}} \quad (6)$$

All of the parameters in equation (6) are known in the circuitry of FIG. 4 based on the measurements mentioned above. Therefore, by extracting Vdsat, one can calculate the value of the mobility μ or of $\mu C_{ox}$ (where $C_{ox}$ can be determined by the value of the current I measured across the resistor).

Figure 7:
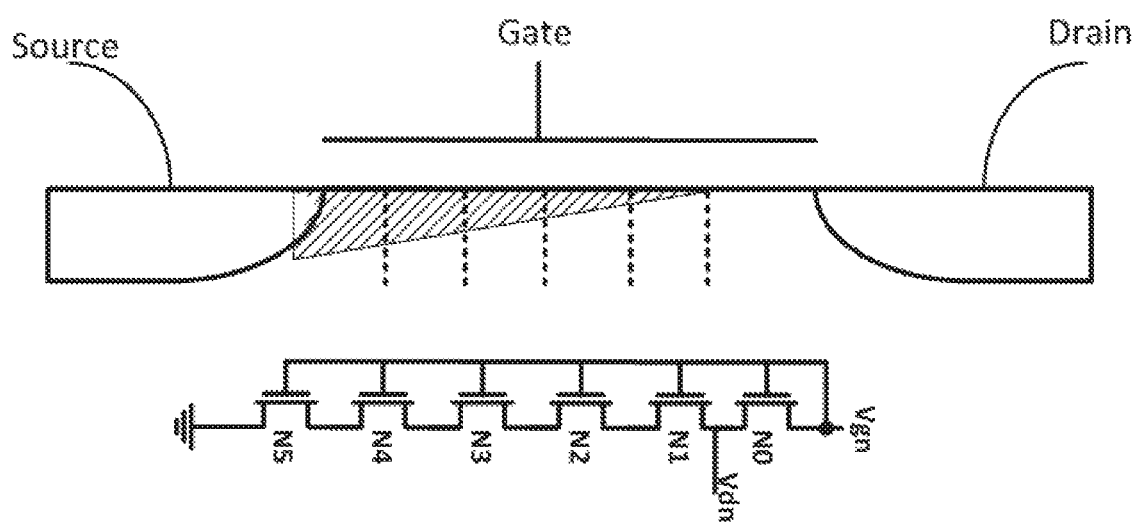
FIG. 7 is a simplified diagram of the NMOS stack of FIG. 5 superimposed on the saturated MOS device of FIG. 6.

FIG. 7 shows the NMOS stack of FIG. 5 superimposed on the saturated MOS device of FIG. 6. If all of the transistors have the same gate connection, the stack can behave as a single device with a very long L. The current is input into Vgn. Since the current is exactly known, N0 can be sized such that $V_{gs}=V_{th}$, so that none of the stack's Vdsat is included in its Vds or Vgs. Thus, the voltage Vdn represents the Vdsat of the stack. Measuring Vdn and applying an equation similar to (6) yields the value of $\mu C_{ox}$ (where $C_{ox}$ can be determined by the value of the current I measured across the resistor) as will be shown. In the case of a PMOS stack (FIG. 5) the current is input into Vgp and both Vgp and Vdp are measured. Vdp is the Vgs of P0, and |Vdp−Vgp| is the Vdsat of stack. For both the NMOS and PMOS stacks, the Vd* nodes are the internal nodes Vi,* which are shown in FIG. 2.

It is desirable to measure the process parameters for minimal L (length) devices, since these are the main devices used the digital circuits which determine the performance of the integrated circuits. This is the reason why it is desirable to measure a stack of minimal L devices, as opposed to increasing the value of L of a single device placed below/ above Vdn/Vdp. Two or more transistors connected in series form a transistor stack. The transistor whose drain is connected to all gates of the transistors in the stack is called the stack drain transistor (P0, N0 in FIG. 5) and its drain is called the stack drain.

The stack drain transistor is in saturation since Vds=Vgs. Assuming that the current density is designed such that Vgs=Vth for the stack drain transistor, all of the Vdsat drops across the rest of the transistors (N1-N5 and P1-P5 in FIG. 5). All of the transistors in the stack, except for the stack drain transistor, are in the linear region. The transistor whose drain is connected to the stack drain transistor's source is referred to as the first linear transistor (N1, P1). The next transistor in the stack is referred to as the $2^{nd}$ linear transistors and so on. The equivalent L of the stack, $L_{st}$ can be expressed as $$L_{st} = \Sigma_{k=1}^{n} L_k \quad (7)$$

where n is the number of linear transistors in the stack. The width W of transistors N1-N5 can (in an non-limiting way) be equal, but not necessarily equal to N0, and similarly the W of transistors P1-P5 can (in a non-limiting way) be equal, but not necessarily be equal to the W of P0. In other words the W of the transistor in the stack drain can be different from the linear transistors in the stack. Thus by plugging in equations (1) and assuming that the linear transistors in the stack behave as a single device one derives:

$$\text{Linear region: } I_D = \mu C_{ox} * \frac{W_{st}}{L_{st}} \left[ (V_{gst} - V_{th})V_{dst} - \frac{1}{2}V_{dst}^2 \right] \quad (8)$$

where $W_{st}$, $L_{st}$ are W is the width of the linear transistors in the stack and Lst is as in (7), $V_{gst}$ and $V_{dst}$ are the Vgs and Vds of the sum of the linear transistors in the stack. Vgst is the difference in the gate voltage of the stack and the source voltage of the last transistor in the stack (N5, P5) and Vdst is the difference between the source voltage of the transistor at the stack drain (this is identical to the drain voltage of the first linear transistor in the stack) and the source voltage of the last linear transistor in the stack. By measuring the Vgs at the stack drain transistor, one can extract Vth, since its Vgs=Vth, and $\mu C_{ox}$ can be extracted by measuring $V_{gst}$ and $V_{dst}$ of the stack and plugging these values into equation 8.

By proper design, the current density of the stack drain transistor should be such that Vgs=Vth. This would require the following equation to be true:

$$V_{gst} - V_{th} = V_{dst} \quad (9)$$

Equation (9) is true by connection for the NMOS stack. The PMOS stack is similar, but the signs are reversed. Plugging equation (9) into (8), the following equation is obtained:

$$I_D = \frac{1}{2}\mu C_{ox} * \frac{W_{st}}{L_{st}} [V_{dst}^2] \quad (10)$$

and $$V_{dst} = \sqrt{\frac{I_D}{\frac{1}{2}\mu C_{ox} * \frac{W_{st}}{L_{st}}}} \quad (11)$$

Equations (10) and (11) behave very similarly to the equations of a saturated transistor in strong inversion— equations (2) and (6). Vdsat is replaced by $V_{dst}$ and W, L are replaced by the W and L of the linear transistors in the stack.

Since the circuit can measure $V_{th}$ and mobility μ, and these functions are also nearly linearly dependent on temperature, the circuit can also function as a temperature sensor. This could be accomplished by measuring the digital output at one or two known temperatures and deriving a function (e.g., polynomial) that best fits this output.

In another embodiment of the invention, both Vth and $\mu C_{ox}$ may be measured by varying the current density driven across a diode connected device. Referring to FIG. 4 and equation (2), the Vth can be extracted by the techniques described earlier by applying a first current density, such as but not limited to, 100 nA/leg. The mobility-$C_{ox}$ product can be extracted from the same circuit if the current density is raised substantially and sufficiently to a second current density in order to place the device in strong inversion. This would require an increase of current density from the first current density to the second current density, such as but not limited to, ~50-100×. Thus, the current density would be, in such an example, 5-10 μA/leg. To reduce mismatch, a large amount of legs would have to be placed in parallel (~100), such that the current would have to be 500 μA-1 mA. In such a manner, both the Vth and $\mu C_{ox}$ could be extracted from equation (2). The current could be increased by raising the frequency of the switched capacitor in FIG. 4 or by any other means. This is a less desirable embodiment for several reasons. Firstly, it requires a lot of power to measure the parameters. Secondly, the switches would have to support both high and low currents. If they were conductive enough at high currents, then their leakage at low currents would be relatively high, which would reduce the accuracy of the measurement. If the leakage is low, then they would not be conductive enough at high currents. It would also be more difficult to design an amplifier and current source which could operate accurately at such a large current range.

What is claimed is:

1. A circuit comprising:
a process monitor circuit comprising a current source, at least one composite circuit element and an analog-to-digital converter (ADC), wherein current from said current source is dropped across said at least one composite circuit element generating a voltage which is measured as a measurement by said ADC, and said measurement yields information about at least one process dependent parameter,
wherein the current source comprises a switched capacitor current source that comprises a flying capacitor $C_{fly}$ coupled to non-overlapping switches, which receive anti-phase frequency inputs from clocks Φ1 and Φ2, and said flying capacitor is switched between voltages $V_{fb}$ and $V_{ss}$, such that its current is:

$$I = C_{fly} V_{fb} f$$

where f represents frequency; and said flying capacitor comprises an MOS device and said switched capacitor current is mirrored or driven across said composite device.

2. The circuit according to claim 1, wherein said circuit is implemented as an on-die process monitor circuit.

3. The circuit according to claim 1, wherein said least one process dependent parameter comprises a threshold voltage $V_{th}$.

4. The circuit according to claim 1, wherein said least one process dependent parameter comprises electron mobility (μ).

5. The circuit according to claim 1, wherein said least one process dependent parameter comprises oxide capacitance ($C_{ox}$).

6. The circuit according to claim 1, wherein said least one process dependent parameter comprises a product of electron mobility and oxide capacitance.

7. The circuit according to claim 1, further comprising at least one multiplexer (MUX) which is configured to select which of said at least one process dependent parameters is to be measured.

8. The circuit according to claim 1, wherein said composite circuit element comprises at least one MOS device and said at least one process dependent parameter is measured for either PMOS or NMOS transistors which are available in the process monitor circuit.

9. The circuit according to claim 8, wherein said at least one MOS device comprises a diode connected transistor and said at least one process dependent parameter is threshold voltage of said at least one MOS device.

10. The circuit according to claim 8, wherein said at least one MOS device comprises a stack of similar type MOS devices all having same gate connections, wherein there is a transistor whose drain is connected to all gates of the transistors in the stack, this drain being called a stack drain and this transistor being called a stack drain transistor, and said stack drain is coupled to said ADC so that said least one process dependent parameter comprises a threshold voltage or a product of electron mobility and oxide capacitance.

11. The circuit according to claim 10, further comprising at least one multiplexer (MUX) which is configured to select which of said at least one process dependent parameters is to be measured, and wherein the stack drain transistor is coupled to the ADC through the MUX at its source and the top of the stack is coupled to the ADC through the MUX.

12. The circuit according to claim 11, where the stack drain transistor is in saturation and the rest of the devices are in a linear region and where the stack drain transistor is governed by the equation:

$$Vgs = Vth$$

and linear transistors in the stack are governed by equations:

$$I_D = \mu C_{ox} * \frac{W_{st}}{L_{st}} \left[ (V_{gst} - V_{th}) V_{dst} - \frac{1}{2} V_{dst}^2 \right]$$

$$\text{and } V_{dst} = \sqrt{\frac{I_D}{\frac{1}{2} \mu C_{ox} * \frac{W_{st}}{L_{st}}}}$$

μ=electron mobility, $C_{ox}$=oxide capacitance and $V_{th}$=threshold voltage;
Wst is the width of said at least one MOS device, and Lst is the sum of the lengths of the linear devices in the stack;
Vgst is the difference between the gate voltage of the stack and the source voltage of the last linear transistor in the stack, while Vdst is the difference between the drain voltage of the first linear transistor in the stack and the source voltage of the last linear transistor in the stack.

13. The circuit according to claim 1, wherein said composite circuit element comprises a resistor.

14. The circuit according to claim 1, wherein the MOS device is an NMOSCAP switch capacitor element.

15. The circuit according to claim 14, wherein said current source receives a reference voltage and a reference frequency, and the reference voltage is duplicated by an amplifier across the switch capacitor element, and the frequency of the switch capacitor element is the reference frequency.

16. The circuit according to claim 15, wherein current driven across the switch capacitor element is mirrored to become said current source of the process monitor circuit.

17. The circuit according to claim 1, wherein said least one process dependent parameter comprises two parameters, threshold voltage and a product of electron mobility and oxide capacitance, and wherein said measurement is carried out by varying a current density driven across a diode connected device that has legs, such that the threshold voltage is measured at a first current density and the product of electron mobility and oxide capacitance is measured at a second current density which is greater than the first current density.

18. A circuit comprising:
a process monitor circuit comprising a current source, at least one composite circuit element and an analog-to-digital converter (ADC), wherein current from said current source is dropped across said at least one composite circuit element generating a voltage which is measured as a measurement by said ADC, and said measurement yields information about at least one process dependent parameter, wherein said composite circuit element comprises at least one MOS device and said at least one process dependent parameter is measured for either PMOS or NMOS transistors which are available in the process monitor circuit, and
wherein said at least one MOS device comprises a stack of similar type MOS devices all having same gate connections, wherein there is a transistor whose drain is connected to all gates of the transistors in the stack, this drain being called a stack drain and this transistor being called a stack drain transistor, and said stack drain is coupled to said ADC so that said least one process dependent parameter comprises a threshold voltage or a product of electron mobility and oxide capacitance, wherein said stack comprises a series-connected transistor stack in which said similar type MOS devices are coupled drain to source.

19. The circuit according to claim 18, further comprising at least one multiplexer (MUX) which is configured to select which of said at least one process dependent parameters is to be measured, and wherein the stack drain transistor is coupled to the ADC through the MUX at its source and the top of the stack is coupled to the ADC through the MUX.

20. The circuit according to claim 19, where the stack drain transistor is in saturation and the rest of the devices are in a linear region and where the stack drain transistor is governed by the equation:

$$V_{gs} = V_{th}$$

and linear transistors in the stack are governed by equations:

$$I_D = \mu C_{ox} * \frac{W_{st}}{L_{st}} \left[ (V_{gst} - V_{th}) V_{dst} - \frac{1}{2} V_{dst}^2 \right]$$

$$\text{and } V_{dst} = \sqrt{\frac{I_D}{\frac{1}{2}\mu C_{ox} * \frac{W_{st}}{L_{st}}}}$$

μ=electron mobility, $C_{ox}$=oxide capacitance and $V_{th}$=threshold voltage;

Wst is the width of said at least one MOS device, and Lst is the sum of the lengths of the linear devices in the stack;

Vgst is the difference between the gate voltage of the stack and the source voltage of the last linear transistor in the stack, while Vdst is the difference between the drain voltage of the first linear transistor in the stack and the source voltage of the last linear transistor in the stack.

* * * * *